(12) United States Patent
Cern

(10) Patent No.: US 7,376,385 B2
(45) Date of Patent: May 20, 2008

(54) REPEATERS SHARING A COMMON MEDIUM FOR COMMUNICATIONS

(75) Inventor: Yehuda Cern, Brookline, MA (US)

(73) Assignee: Ambient Corporation, Newton, MA (US)

( * ) Notice: Subject to any disclaimer, the term of this patent is extended or adjusted under 35 U.S.C. 154(b) by 583 days.

(21) Appl. No.: 10/688,263

(22) Filed: Oct. 17, 2003

(65) Prior Publication Data
US 2005/0020233 A1 Jan. 27, 2005

Related U.S. Application Data

(60) Provisional application No. 60/419,174, filed on Oct. 17, 2002.

(51) Int. Cl.
*H04B 7/15* (2006.01)
*H04B 3/36* (2006.01)
*H04B 7/14* (2006.01)

(52) U.S. Cl. .............................. 455/1.11; 455/7; 455/14
(58) Field of Classification Search ................ 455/7, 455/402, 422.1, 11.1, 16, 14; 340/310.04, 340/310.03, 310.06; 375/211; 379/29.01, 379/348, 398
See application file for complete search history.

(56) References Cited

U.S. PATENT DOCUMENTS

| | | | |
|---|---|---|---|
| 3,973,087 A * | 8/1976 | Fong | 375/211 |
| 4,184,056 A | 1/1980 | Basch et al. | 179/175.3 |
| 4,777,652 A | 10/1988 | Stolarczyk | 455/3 |
| 5,668,658 A | 9/1997 | Hamada | 359/341 |
| 6,032,020 A * | 2/2000 | Cook et al. | 455/7 |
| 6,041,065 A | 3/2000 | Melvin | 370/492 |
| 6,690,916 B1 * | 2/2004 | Yenerim | 455/11.1 |
| 6,985,715 B2 * | 1/2006 | Lee | 455/402 |
| 6,993,317 B2 * | 1/2006 | Belsak, Jr. | 455/402 |
| 2003/0043027 A1 | 3/2003 | Carson et al. | 340/310.01 |
| 2006/0183421 A1 * | 8/2006 | Proctor et al. | 455/11.1 |
| 2006/0205341 A1 * | 9/2006 | Runyon | 455/11.1 |

OTHER PUBLICATIONS

International Search Report Application No. PCT/US03/33082 dated Jul. 2, 2004.

* cited by examiner

*Primary Examiner*—Tilahun Gesesse
(74) *Attorney, Agent, or Firm*—Ohlandt, Greeley, Ruggiero & Perle, LLP

(57) ABSTRACT

A system for communications on a bi-directional medium includes a first repeater, a second repeater, a third repeater and a fourth repeater, each of which is coupled to the medium. The first repeater and the second repeater communicate with each other on a first band for transmission from the first repeater to the second repeater, and on a second band for transmission from the second repeater to the first repeater. The second repeater and the third repeater communicate with each other on a third band for transmission from the second repeater to the third repeater, and on a fourth band for transmission from the third repeater to the second repeater. The third repeater and the fourth repeater communicate with each other on the second band for transmission from the third repeater to the fourth repeater, and on the first band for transmission from the fourth repeater to the third repeater.

2 Claims, 1 Drawing Sheet

REPEATERS SHARING A COMMON MEDIUM FOR COMMUNICATIONS

CROSS-REFERENCE TO RELATED APPLICATIONS

The present application is claiming priority of U.S. Provisional Patent Application Ser. No. 60/419,174, filed on Oct. 17, 2002, the content of which is herein incorporated by reference.

BACKGROUND OF THE INVENTION

1. Field of the Invention

The present invention relates to communications, and more particularly, to an arrangement of repeaters for communications on a bi-directional medium. The arrangement is suited for communications over a power line.

2. Description of the Related Art

Many types of communications media are characterized by a single signal medium whose physical continuity cannot be interrupted. There are also communications transducers that are totally bi-directional, as opposed to being omni-directional, or have very limited directionality. Examples include energized electrical power wires, gasses and fluids confined to pipes, and certain optical media.

For example, for power line communications, a signal is coupled to a wire in a non-directional manner, that is, the signal may propagate in both directions along a wire. Often, one direction is an intended direction and the other direction is unintended.

At some distance from a signal source of a signal, a signal to noise ratio will deteriorate to a point that a repeater is necessary to allow data represented by the signal to be conveyed at reasonable quality beyond that point. For a full duplex modem that is continuously transmitting, a receiver can receive signals from both directions, and the possibility exists for signals propagating in an unintended direction to interfere with intended signals.

If multiple frequency bands are available, then the repeater may receive at one frequency and retransmit at another frequency. However, even this arrangement does not ensure immunity from interference, especially if the level of the intended signal is similar to that of the unintended signal, due to similar attenuations between the respective transmitters and the receiver.

SUMMARY OF THE INVENTION

The present invention relates to communications, and more particularly, to an arrangement of repeaters for communications on a bi-directional medium. The system includes a first repeater, a second repeater, a third repeater and a fourth repeater, each of which is coupled to the medium. The first repeater and the second repeater communicate with each other on a first band for a transmission from the first repeater to the second repeater, and on a second band for a transmission from the second repeater to the first repeater. The second repeater and the third repeater communicate with each other on a third band for a transmission from the second repeater to the third repeater, and on a fourth band for a transmission from the third repeater to the second repeater. The third repeater and the fourth repeater communicate with each other on the second band for a transmission from the third repeater to the fourth repeater, and on the first band for a transmission from the fourth repeater to the third repeater.

DESCRIPTION OF THE INVENTION

Figure 1:
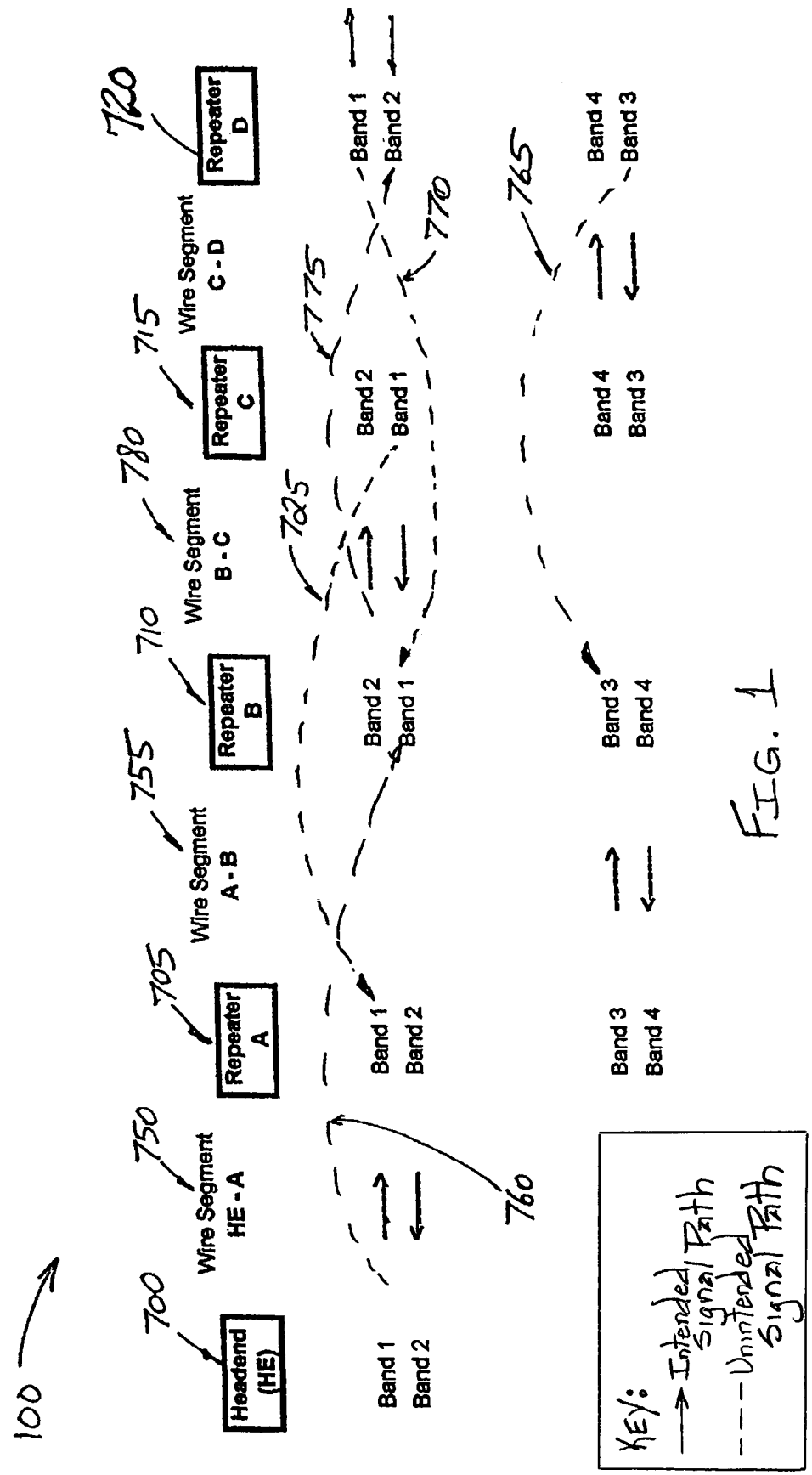
FIG. 1 is a block diagram of a configuration of repeaters in a power line communication system.

The present invention relates to communications, and more particularly, to an arrangement of repeaters for communications on a bi-directional medium. The arrangement is described herein in the context of a power line communications system, but can be used on any bi-directional medium, and is particularly well suited for full duplex communications over a single continuous bi-directional medium.

FIG. 1 is a block diagram of a configuration of repeaters in a power line communication system 100. System 100 includes a head-end (HE) 700, a Repeater A 705, a Repeater B 710, a Repeater C 715, and a Repeater D 720. A selection of frequency bands can be used at the various repeaters, so as to reduce an amplitude of an unintended signal relative to that of an intended signal.

HE 700 transmits to Repeater A 705 on frequency Band 1 and listens on Band 2.

Repeater A 705 listens to HE 700 on Band 1 and transmits to HE 700 on Band 2. Repeater A 705 also transmits to Repeater B 710 on Band 3, and listens to Repeater B 710 on Band 4.

Repeater B 710 listens to Repeater A 705 on Band 3, and transmits to Repeater A 705 on Band 4. Repeater B 710 also transmits to Repeater C 715 on Band 2, and listens to Repeater C 715 on Band 1.

Repeater C 715 listens to Repeater B 710 on Band 2, and transmits to Repeater B 710 on Band 1. Repeater C 715 also transmits to Repeater D 720 on Band 4, and listens to Repeater D 720 on Band 3.

By arranging Repeater B 710 to transmit to Repeater C 715 on Band 2 while listening on Band 1, an unintended path 725 for a Band 1 signal from Repeater C 715, traverses two wire segments, namely a wire segment B-C 780 and a wire segment A-B 755. The Band 1 receiver at Repeater A 705 receives its intended signal from HE 700, which traverses one wire segment, namely a wire segment HE-A 750, while the unintended signal from Repeater C is likely to be more attenuated, having traversed two wire segments. Similarly, other unintended paths 760, 765, 770 and 775 span two wire segments, and thus attenuate unintended signals.

There is thus provided a system for communications on a bi-directional medium. For purpose of illustration, regard HE 700 as a first repeater, Repeater A 705 as a second repeater, Repeater B 710 as a third repeater, and Repeater C 715 as a fourth repeater. The system thus includes a first repeater, a second repeater, a third repeater and a fourth repeater, each of which is coupled to the medium. The first repeater and the second repeater communicate with each other on a first band for a transmission from the first repeater to the second repeater, and on a second band for a transmission from the second repeater to the first repeater. The second repeater and the third repeater communicate with each other on a third band for a transmission from the second repeater to the third repeater, and on a fourth band for a transmission from the third repeater to the second repeater. The third repeater and the fourth repeater communicate with each other on the second band for a transmission from the third repeater to the fourth repeater, and on the first band for a transmission from the fourth repeater to the third repeater.

It should be understood that various alternatives, combinations and modifications of the teachings described herein could be devised by those skilled in the art. The present invention is intended to embrace all such alternatives, modifications and variances that fall within the scope of the appended claims.

What is claimed is:

1. A system, comprising:

a first repeater, a second repeater, a third repeater and a fourth repeater, each of which is coupled to a wire that is common to said first, second, third and fourth repeaters, wherein said first repeater and said second repeater communicate with each other via said wire on a first band for a transmission from said first repeater to said second repeater, and on a second band for a transmission from said second repeater to said first repeater, wherein said second repeater and said third repeater communicate with each other via said wire on a third band for a transmission from said second repeater to said third repeater, and on a fourth band for a transmission from said third repeater to said second repeater, and wherein said third repeater and said fourth repeater communicate with each other via said wire on said second band for a transmission from said third repeater to said fourth repeater, and on said first band for a transmission from said fourth repeater to said third repeater.

2. The system of claim 1, wherein said wire is a power line.

* * * * *